(12) United States Patent
Yajima

(10) Patent No.: US 6,484,139 B2
(45) Date of Patent: Nov. 19, 2002

(54) VOICE FREQUENCY-BAND ENCODER HAVING SEPARATE QUANTIZING UNITS FOR VOICE AND NON-VOICE ENCODING

(75) Inventor: Hisashi Yajima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/739,676

(22) Filed: Dec. 20, 2000

(65) Prior Publication Data

US 2001/0007973 A1 Jul. 12, 2001

Related U.S. Application Data

(63) Continuation of application No. PCT/JP00/02464, filed on Apr. 14, 2000.

(30) Foreign Application Priority Data

Apr. 20, 1999 (JP) ............................................. 11-112013

(51) Int. Cl.[7] .......................... G10L 19/00; H04M 3/00
(52) U.S. Cl. ........................ 704/230; 379/283; 379/282
(58) Field of Search ........................ 704/230; 379/282, 379/283

(56) References Cited

U.S. PATENT DOCUMENTS

| | | | |
|---|---|---|---|
| 4,393,272 A | | 7/1983 | Itakura et al. |
| 6,131,084 A | * | 10/2000 | Hardwick .................. 704/230 |
| 6,161,089 A | * | 12/2000 | Hardwick .................. 704/230 |
| 6,208,715 B1 | * | 3/2001 | Haavisto .................. 379/88.07 |

FOREIGN PATENT DOCUMENTS

| | | |
|---|---|---|
| JP | 9081199 A | 3/1997 |
| JP | 10124097 A | 5/1998 |
| JP | 11205485 A | 7/1999 |

OTHER PUBLICATIONS

International Telecommunication Union, Coding Of Speech At 8 kbit/s Using Conjugate–Structure Algebraic–Code–Excited Linear–Prediction, Mar. 1996, pp. 1–35.
Redwan Salami, et al., Design and Description of CS–ACELP: A Toll Quality 8 kb/s Speech Coder, vol. 6, No. 2, Mar. 1998, pp. 116–130.
International Search Report for PCT/JP00/02464 Jul. 25, 2000.

* cited by examiner

*Primary Examiner*—Tālivaldis Ivars Šmits

(57) ABSTRACT

A voice encoding device according to the present invention includes an encoder having a first quantizing block suitable for voice encoding and a second quantizing block suitable for non-voice encoding and compressively encoding input signals, a voice/non-voice signal identification unit for identifying whether an signal input to the encoder is a voice signal or a non-voice signal and outputting a determination result, and a multiplexer portion for multiplexing respective outputs from the first quantizing block and the second quantizing block in order to output to a transmission path. In this case, the encoder has a selector for selecting either one of the first quantizing block or the second quantizing in accordance with the determination result from the voice/non-voice signal identification unit, and the first quantizing block and the second quantizing block compressively encode signals by using a same quantization table.

6 Claims, 13 Drawing Sheets

VOICE FREQUENCY-BAND ENCODER HAVING SEPARATE QUANTIZING UNITS FOR VOICE AND NON-VOICE ENCODING

CROSS REFERENCE TO RELATED APPLICATION

This is a continuation of International Application PCT/JP00/02464, with an international filing date of Apr. 14, 2000, the contents of which is hereby incorporated by reference into the present application.

TECHNICAL FIELD

The present invention relates to an voice encoder used in voice digital wired communication and radio communication, in particular to a method for improving an voice encoder for transmitting non-voice signal using an voice frequency band, such as dual tone multi frequency, DTMF, signals and push button, PB, signals.

BACKGROUND ART

The reduction of communication cost is the most important issue in the private (i.e., local) network. In order to achieve highly efficient transmission of voice signals occupying most part of communication traffics, cases where highly efficient voice encoder based on voice encoding and decoding is applied is increasing, which is exemplified by 8 kbit/s conjugate-structure algebraic-code-excited linear prediction, CS-ACELP, voice encoding method (ITU-T Recommendation G, 729 compliant).

The voice encoding algorithm where the transmission speed is 8 kbit/s has a structure where input signals are specific to voice signals in order to obtain high quality voice with less information amount. This will be described with reference to the 8 kbit/s CS-ACELP system. FIG. 9 shows a schematic block diagram of an encoder, and FIG. 10 shows a detail block diagram of the encoder.

This encoding method has an encoding algorithm where the human vocalizing mechanism is modeled. In other words, it is based on CELP method, which uses a composite filter 6 (linear filter corresponding to a voice spectral envelope) where human vocal tract information is modeled to drive time series signals (outputs of an adder 15) stored in a code book corresponding to the human vocal cords information.

The detailed description of the algorithm can be found in ITU-T Recommendation G. 729, "Coding of Speech at 8 kbit/s using Conjugate-Structure Algebraic-Code Excited Linear Prediction (CS-ACELP)".

In the coding algorithm specific to voices, higher efficient transmission tends to deteriorate transmission characteristics of signals (such as DTMF signals, PB signals, No. 5 signaling, modem signals) other than voice: signals using the voice frequency band in a transmission path using the highly efficient voice encoder.

Of one example showing the condition, details of LSP quantizer portion will be described with reference to FIG. 11. FIG. 11 shows an LSP quantifier portion (309) within an encoder based on the CS-ACELP method shown in FIG. 9. FIG. 11 includes an MA prediction component calculator 308 for calculating Moving Average (MA) of an LSP, a multiplier 330, adders 331, 332, and 333, a quantized error weighting coefficient calculator portion 338 for calculating a weighting coefficient based on an input LSP coefficient, a least square error calculator 334 for calculating a square error between a quantized LSP vector calculated in the adder 332 and an LSP vector calculated based on an input voice signals and multiplying it by the weighting coefficient calculated in 334 to select a least square error among quantifier LSP vector candidates, the first stage LSP codebook 335, the second stage LSP codebook 336, and an MA prediction coefficient codebook 337 where a plurality kinds of sets of MA coefficients.

Since the LSP quantization method using this structure is described in detail in "CS-ACELP no LSP to gain no ryoushikahou", Kataoka et al., NTT R&D, Vol. 45 No. 4, 1996, pp. 331–336. Thus, the description is omitted here. It is known that the LSP quantization method is used so that voice signal spectral envelop information can be quantized efficiently.

According to the CS-ACELP voice coding method, the quantization of LSP coefficients is achieved by following three processes. That is, the LSP quantizer portion 309 has three processing function blocks as shown below:

(1) an MA (Moving Average) prediction component calculator portion 308 for subtracting a predictable component between frames in order to achieve efficient quantization;

(2) the first stage LSP quantization code book 335 for using an adaptive code book learned from voices to achieve rough quantization; and (3) the second stage LSP quantization code note 336 for finely adjusting random number series for an target LSP, which is quantized roughly in the first stage.

The MA (Moving Average) in (1) is used so that signals with few radical changes in frequency characteristics, that is, having strong correlation between frames can be quantized efficiently. Further, the adaptive code book of (2) is used so that a schematic form of a spectral envelope specific to audio signals can be expressed efficiently with a few information amounts. Furthermore, when the random code book of (3) is used in addition to the learned code book of (2) so that slight changes in spectral envelop can be followed flexibly. In consideration of the above-described reasons, it can be said that the LSP quantifier portion 309 is a well suitable method for coding characteristics of voice spectral envelope information efficiently. On the other hand, in order to code non-voice signals, especially DTMF signals, characteristics as described below must be considered:

Voice signals and DTMF signals differ significantly in spectral envelope;

radical changes in spectral characteristics are found between a signal continue time and a pause time. Gains also changes radically. However, a change amount in spectral characteristics and gains only for the duration of DTMF signals is extremely small;

Since quantization distortion of LSP is reflected on frequency distortion of DTMF as it is, the LSP quantization distortion must be small as much as possible; and For the duration of the DTMF signals, the frequency characteristic is extremely stable.

In consideration of the above-described viewpoints, it cannot be said that the LSP quantizer portion 301 is an effective method for coding the spectral envelope of DTMF signals.

As described in the example above, the non-voice signals such as DTMF signals have different characteristics from those of voice signals in several viewpoints. Thus, when the non-voice signals are coded, it is not suitable to use a same method as one used for voice signals under the condition where the transmission bit rate is low and redundancy for coding is small.

By the way, in the private network, for the call set-up in the telephone communication, the in-channel signalling is performed by using DTMF signals instead of the common channel signalling. In this case, if an allocated transmission path uses the voice coding, it deteriorates transmission characteristics of the DTMF signals. As a result, the call set-up frequently cannot be achieved normally.

As the first solution for overcoming the problem, a device configuration in FIG. 12 as disclosed in Japanese Unexamined Patent Application Publication No. 9-81199 may be adopted. This configuration includes a unit for, identifying a voice signal and a non-voice signal such as a DTMF signal on the transmission side and memories for storing patterns in which the DTMF signal is pre-decoded on the transmission side and a receiver side. When the identification unit identified a DTMF signal input, an index of a memory holding the coded patterns corresponding to a number of :DTMF to the receiver side, where the index was identified to generate a DTMF signal corresponding to the digit.

As the second solution for overcoming the problem, a device configuration in FIG. 13 may be adopted, for example. An encoder 101 includes one which is optimized for coding voice signals and one which is optimized for compressively coding non-voice signals (such as DTMF signal) with less distortion. The configuration includes a unit for identifying whether a signal to be transmitted is voice or non-voice and selecting one of the function blocks based on the determination result from the identification unit for coding processing. Further, the configuration includes a unit for folding the determination result into an encoder output so that transmission can be achieved without changing its transmission bit-rate and with least deterioration in voice quality. Furthermore, a searching unit corresponding to the encoder 101 is provided on a side of a decoder 201 also.

Next, operations of the voice coding and decoders will be described. On the transmission side in FIG. 13, a voice/non-voice signal identification unit 102 always monitors whether an input signal is a voice signal or a non-voice signal and determines an operation mode of the encoder 101 based on the determination result. If the voice/non-voice signal identification unit 102 determines it as "voice", switches 103 and 14 are turned to 103A and 104A sides, respectively. As a result, within the encoder 101, a coding processing function block 105 is selected so as to achieve an operation mode suitable for coding a voice signal efficiently ("voice mode" hereinafter).

Under this mode, the encoder 101 performs coding processing on the voice signal based on a coding algorithm and outputs a code corresponding to the input voice. On the other hand, if the voice/non-voice signal identification unit 102 determines it as "non-voice", the switches 103 and 14 are turned to 103B and 104B sides, respectively. As a result, within the encoder 101, the coding processing function block 106 is selected so as to achieve an operation mode suitable for compressively coding the non-voice signal, such as DTMF signal, with less distortion ("non-voice mode" hereinafter).

Under this mode, the encoder 101 performs coding processing on the non-voice signal, such as DTMF signal, based on a coding algorithm and outputs a code corresponding to the input non-voice signal. Further, a multiplexer portion 107 multiplexes one obtained by coding a voice signal or a non-voice signal (voice/non-voice code, hereinafter) and a result from identification of an input signal(voice signal or non-voice signal), which is output from the voice/non-voice signal identification unit 102 and send it to the transmission path.

On the receiver side in FIG. 13, first of all, the bit sequence received from the transmission path is separated into voice/non-voice codes and a determination result of the voice/non-voice identification unit 102 in a demultiplexer portion 202. If the determination results by the voice/non-voice signal identification unit 102 taken out of the signal array is "voice", switches 203 and 204 are turned to 203A and 204A sides, respectively. As a result, within the decoder 201, a decoding processing function block 205 is selected, which achieves in the decoder an operation mode corresponding to the voice mode in the encoder 101. Under this mode, the decoder 201 performs decoding processing based on a decoding algorithm in order to decode the voice signals. Here, since both encoding and decoding are performed under the voice mode, the decoded voice signals have quality in accordance with the original performance the coding algorithm has.

If the determination results by the voice/non-voice signal identification unit 102 taken out of the signal array in the demultiplexer portion 202 is "non-voice", switches 203 and 204 are turned to 203B and 204B sides, respectively. As a result, within the decoder 201, a decoding processing function block 206 is selected, which achieves in the decoder an operation mode corresponding to the non-voice mode in the encoder 101. Under this mode, the decoder 201 performs decoding processing based on a decoding algorithm in order to decode the non-voice signals. Here, since both encoding and decoding are performed under the non-voice mode, the decoded non-voice signals have even less distortion than those performed under the voice mode.

According to the conventional embodiment as described above, coding and decoding are performed based on;a method using a general voice coding/decoding algorithms more suitable for coding voices during voice signal transmission, or by switching a part of processing function block into a method more suitable for coding non-voice signals during non-voice signal, especially DTMF signal, transmission. Thus, during the non-voice signal transmission, high quality non-voice signals can be transmitted without an increase in transmission bit rate.

When a voice communication system based on the conventional example is established, it is required to have the non-voice mode in both encoder 101 and decoder 201. Only improvement in the transmission side (coding side) cannot allow the decoder side to address the non-voice mode. As a result, nothing can decode normal voice signals, which may cause undesirable phenomena for a caller, such occurrence of noises.

By the way, when enterprise communication system is established, for example, voice transmission equipments cannot be replaced concurrently on sender and receiver sides for various reasons. For example, it is assumed that a voice transmission device (such as multimedia multiplexer equipments) are established which have voice encoder and decode based on the CS-ACELP method conforming to conventional ITU-T Recommendation G. 729. In this case, even if the voice transmission device addressing the non-voice mode is replaced only the transmission side for the purpose of achieving DTMF in-channel transmission, mutual connections cannot be performed because the voice transmission device on the receiver side is still a conventional decoder. Thus, the voice transmission device must be replaced. However, it requires further expensive investment for the user of the voice transmission device, which makes the replacement difficult.

DISCLOSURE OF INVENTION

The present invention was made for overcoming the conventional problems. It is an object of the present invention to provide a voice encoder for the improvement of transmission characteristics of non-voice signals such as DTMF signals by permitting mutual connections with a conventional decode and in-channel transmission of non-voice signals such as DTMF signals when highly efficient voice encoder and decoder are provided which maintain voice transmission quality a given coding algorithm originally has.

A voice encoding device according to the present invention includes an encoder having a first quantizing block suitable for voice encoding and a second quantizing block suitable for non-voice encoding and compressively encoding input signals, a voice/non-voice signal identification unit for identifying whether an input signal to the encoder is a voice signal or a non-voice signal and outputting a determination result, and a multiplexer portion for multiplexing respective outputs from the first quantizing block and the second quantizing block in order to output to a transmission path. In this case, the encoder has a selector for selecting either one of the first quantizing block or the second quantizing in accordance with the determination result from the voice/non-voice signal identification unit, and the first quantizing block and the second quantizing block compressively encode signals by using a same quantization table.

The first and second quantizing blocks are processing blocks for quantizing a line spectral pair (LSP) coefficient.

When the LSP coefficient is quantized, the first and second coefficient quantizing blocks have a different evaluation criteria to be used for determining an appropriate quantized value from each other.

Further, when the LSP coefficient is quantized, the evaluation criteria used for determining an appropriate quantized value is changed adaptively in accordance with a characteristic of an input voice signal in the first quantizing block, while the evaluation criteria is steady regardless of a characteristic of an input voice signal in the second quantizing block.

Also, the voice/non-voice signal identification unit has digit detector for detecting a digit of a DTMF signal; and inputs an LSP coefficient to the second quantizing block.

The voice/non-voice signal identification unit uses a closed loop searching method as a method for searching an LSP codebook.

The second quantizing block uses a linear prediction residual signal of an input voice signal as a parameter used for determining an appropriate quantized value.

BEST MODE FOR CARRYING OUT THE INVENTION

Example 1

Figure 1:
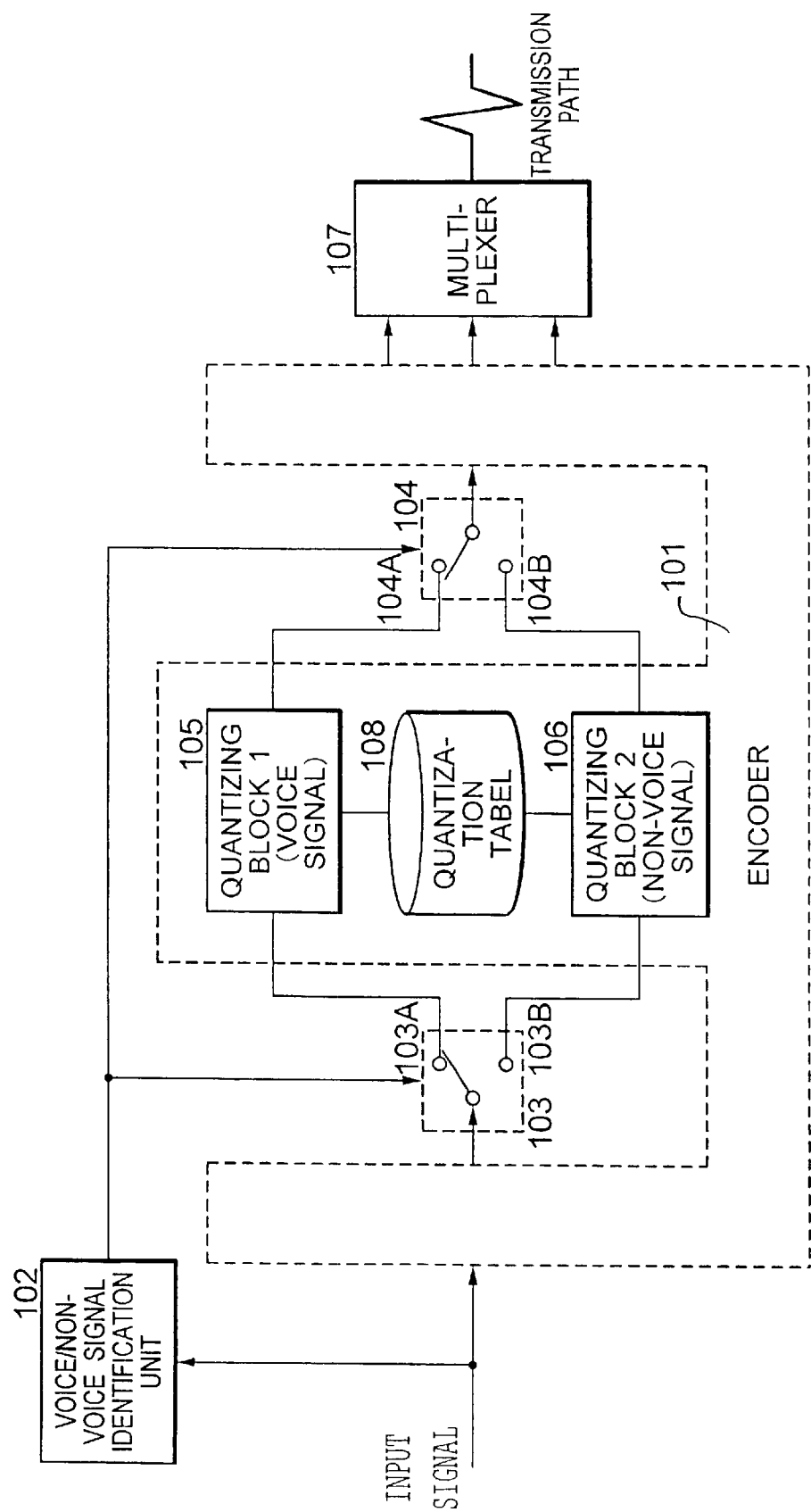
FIG. 1 is a block diagram showing a configuration of a voice encoder in EXAMPLE 1 according to the present invention.

One example of the present invention will be described with reference to a drawing as follows:

FIG. 1 is a block diagram showing a configuration of a voice encoder of a first example of the present invention. FIG. 1 includes an encoder 101 for compressively encoding voice signals efficiently based on a given algorithm, a voice/non-voice signal identification unit 102 for identifying whether an input signal to the encoder is a voice signal or non-voice signal (such as DTMF signal, PB signal and signalling system No. 5) in order to output a determination result, switches 103 and 104 as a selector, parameter quantizing blocks 105 and 106 for quantizing certain parameters of the encoder 101, respectively, a quantization table 108 to be referenced at the quantizing blocks, and a multiplexer portion 107 for multiplexing parameters quantized in the quantizing blocks 105 and 106 and other quantized parameter encoded in the encoder 101.

Here, the quantizing block 105 is the first quantizing block, which is arranged to perform suitable quantization on voice signals. On the other hand, the quantizing block 106 is the second quantizing block, which is arranged to perform suitable quantization on non-voice signals (such as DTMF signals). For example, it is assumed that the quantizing blocks 105 and 106 differ in determination criteria for determining "suitable" one during the quantization table searches. In this case, in order to implement this example, the quantization table 108 to be referenced by the quantizing blocks 105 and 106 when performing quantization must be identical. Also, code words (such as quantization index) allocated to quantize values must be common between the quantizing blocks 105 and 106.

Next, operations of the voice encoder will be described. In FIG. 1, the voice/non-voice signal identification unit 102 always monitors whether an input signal is a voice signal or a non-voice signal and determines an operation mode of the encoder 101 based on the determination result. If the voice/non-voice signal identification unit 102 determines it as "voice", the switches 103 and 104 are turned to 103A and 104A sides, respectively. As a result, within the encoder 101, a coding processing function block (i.e. the quantizing block 105) is selected so as to achieve an operation mode suitable for coding a voice signal efficiently ("voice mode" hereinafter). Under this mode, the encoder 101 performs coding processing on the voice signal based on a coding algorithm and outputs a code corresponding to the input voice.

On the other hand, if the voice/non-voice signal identification unit 102 determines it as "non-voice", the switches 103 and 104 are turned to 103B and 104B sides, respectively. As a result, within the encoder 101, a coding processing function block (i.e. the quantizing block 106) is selected so as to achieve an operation mode suitable for compressively coding the non-voice signal, such as a dual-tone-multi-frequency (DTMF) signal, with less distortion ("non-voice mode" hereinafter). Under this mode, the encoder 101 performs coding processing on the non-voice signal, such as DTMF signal, based on a coding algorithm and outputs a code corresponding to the input non-voice signal.

An operation of the voice/non-voice identification unit 102 will be described by using a DTMF signal as one example of a non-voice signal to be identified. A DTMF signal includes a dual tone, and a frequency component of an output signal is fixed to a specific value based on the regulation. Accordingly, methods below are used for extracting a characteristic amount on a frequency number:

FFT is used for frequency analysis; or a band pass filter is used for filtering a specific frequency component. Then, it is determined whether or not the characteristic amount matches to the characteristic amount of the DTMF signal for identification.

Since the transmission level of the DTMF signal is limited to a specific range according to the regulation and has small dynamic range, the characteristics of the DTMF signal is significantly different from the voice signal, which has relatively a wider dynamic range. Therefore, the input signal level is monitored and it is used as auxiliary information for DTMF signal identification. Thus, it allows enhancing accuracy of detecting DTMF signals. The voice/non-voice signal identification unit 102 uses an input signal to calculate the parameter independently. Then, it can determine and output the result based on it.

The multiplexer portion 107 multiplexes the quantized parameter obtained in the 105 or 106 and another quantized parameter obtained in another processing block in the encoder 101 and required for voice coding, which is sent to the transmission side via the transmission line. Here, the identification result output from the voice/DTMF signal identification unit 102 uses common quantization table 108 and code words corresponding to the quantized value. Thus, the identification result is no longer required information for decoding. Accordingly, it does not have to be sent to the receiver side. Therefore, a bit sequence (frame sequence) sent from the multiplexer portion 107 can be the same format used by the conventional encoder.

Since the bit sequence sent from the transmission side is exactly the same as conventional one and physical characteristics of a parameter for expressing a code word is also in common with the conventional encoder. Therefore, the receiver side can perform decoding by using the exactly same configuration as that of the conventional decoder.

As described above, according to this example, coding is performed based on a method using a general voice coding algorithm more suitable for voice coding during voice signal transmission, or by switching a part of processing function block into a quantization method more suitable for non-voice signal coding during non-voice signal, especially DTMF signal, transmission. Therefore, a common bit sequence is used between voice transmission and non-voice transmission so that the non-voice signal can be transmitted in more suitable manner.

Further, in this example, a part of functions of coding processing is changed but nothing related to the essential part of a given algorithm is switched. Thus, when the voice/non-voice signal identification unit 102 misidentifies a voice signal input as "non-voice", for example, a certain level of voice transmission quality can be maintained with some deterioration. Advantageously, it can prevent the problem that a noisy sound during call is also decoded.

Example 2

Figure 2:
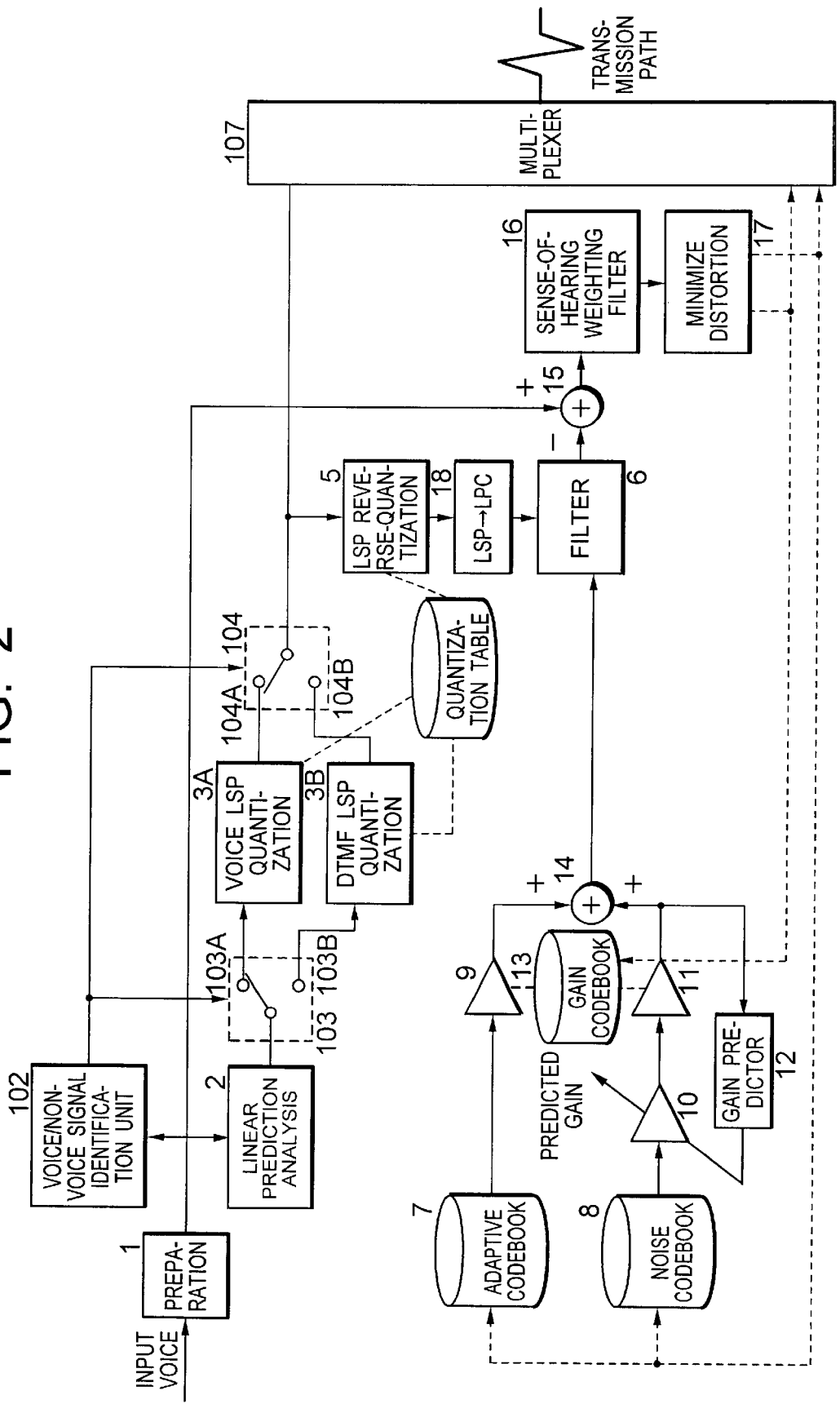
FIG. 2 is a block diagram showing a configuration of a voice encoder in EXAMPLE 2 according to the present invention.
Figure 9:
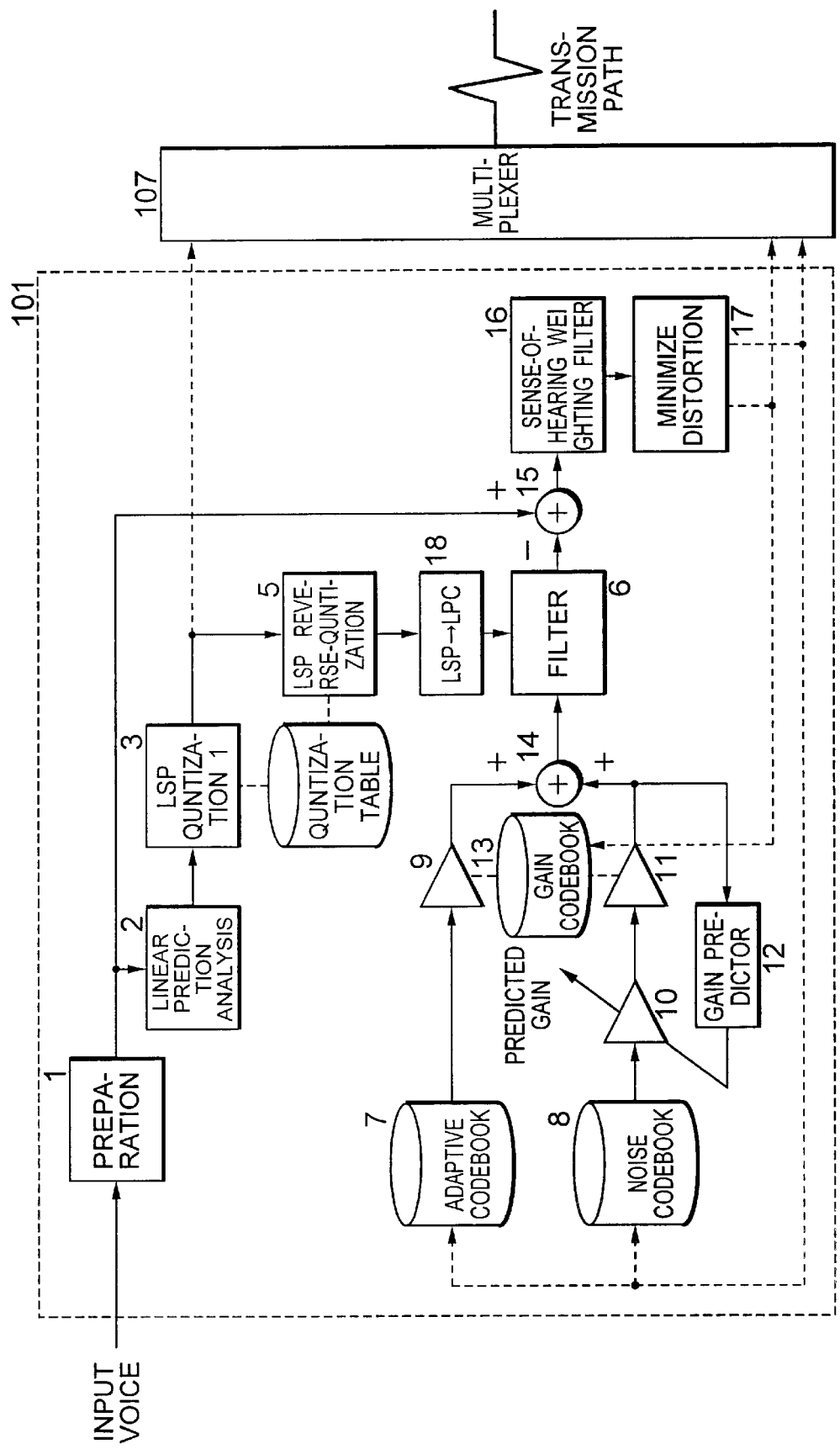
FIG. 9 is a schematic block diagram of a conventional encoder.
Figure 10:
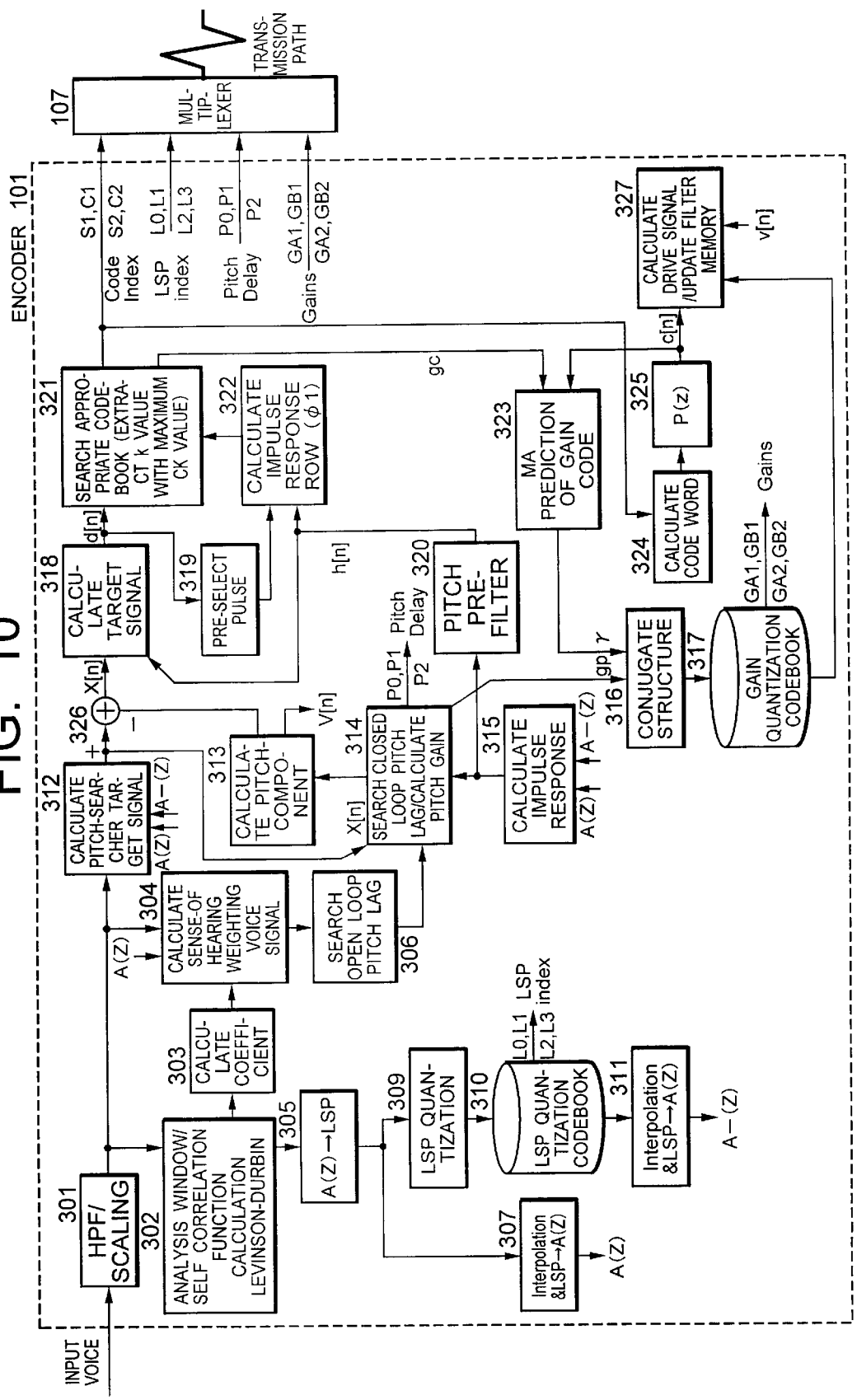
FIG. 10 is a further detail block diagram of the encoder in FIG. 9.

A second example according to the present invention will be described with reference to FIG. 2 as follows: This example describes on operation example in detail where a line spectral pair (LSP) quantizer potion is applied to the quantizing blocks 105 and 106 of the example 1. For simple description, it is assumed that CS-ACELP method (IFTU-T Recommendation G. 729 compliant) is used as one example of the coding algorithm. A detail block diagram of the encoder based on the CS-ACELP method is as shown in FIG. 9. FIG. 2 includes LSP quantizing blocks 3A and 3B for performing LSP quantization. The LSP quantizing block 3A is a quantizer optimized for quantization of an LSP parameter of a voice signal (voice LSP quantizer, hereinafter) while the LSP quantizing block 3B is a quantizer optimized for quantization of an LSP parameter of DTMF (DTMF LSP quantizer hereinafter). Elements having the same reference numbers as those in FIGS. 1, 9, and 10 have the same functions as those described in EXAMPLE 1. Thus, description therefor is omitted here.

In an encoder for encoding voices efficiently, a line spectral pair (LSP) is often used as a method for expressing voice signal spectral envelope information efficiently.

Thus, in the CS-ACELP method, the LSP method is adopted as a transmission method of the voice spectral envelope information parameter. LSP is described in detail in "Line Spectral Pair (LSP) Onsei Bunseki Gousei Houshiki niyoru Onsei Jouhou Assyuku," Sugemura and Itakura, Dehshi Tsushin Gakkai Ronbunshi '81/08 Vol. J64-A, No. 8, pp.599–606. Thus, the description therefor is omitted here.

Next, operations of the encoder will be described. In FIG. 2, the voice/non-voice signal identification unit 102 always monitors whether an input signal is a voice signal or a non-voice signal and determines states of the switches 103 and 104 based on the determination result. If the voice/non-voice signal identification unit 102 determines it as "voice", switches 103 and 104 are turned to 103A and 104A sides, respectively. As a result, the voice LSP quantizer 3A is selected as a quantizing block to set the voice mode. If the voice/non-voice signal identification unit 102 determines it as "non-voice", switches 103 and 104 are turned to 103B and 104B sides, respectively. As a result, the DTMF LSP quantizer 3B is selected as a quantizing block to set the non-voice mode.

Figure 11:
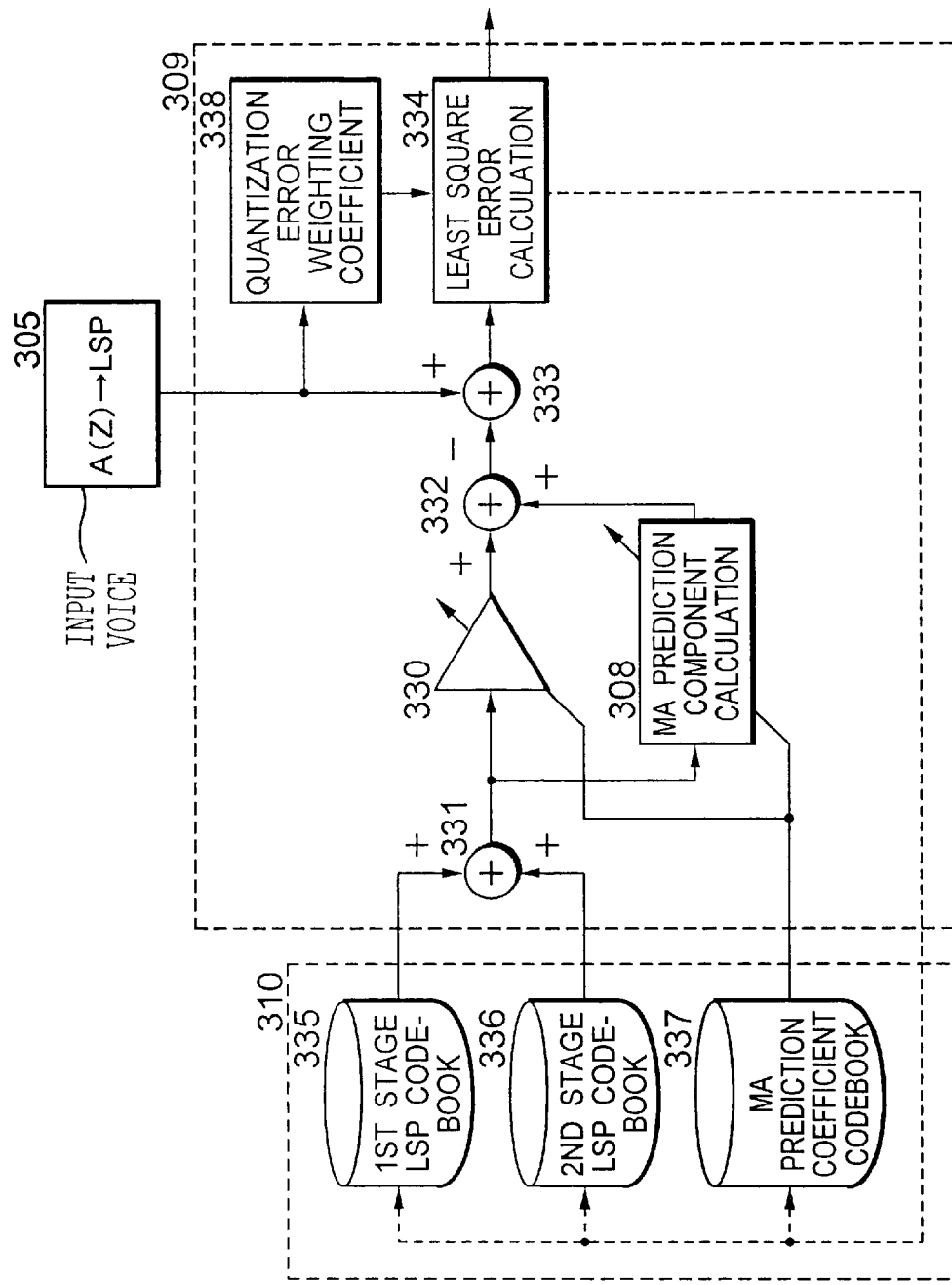
FIG. 11 is a diagram showing an LSP quantizer portion in detail.
Figure 12:
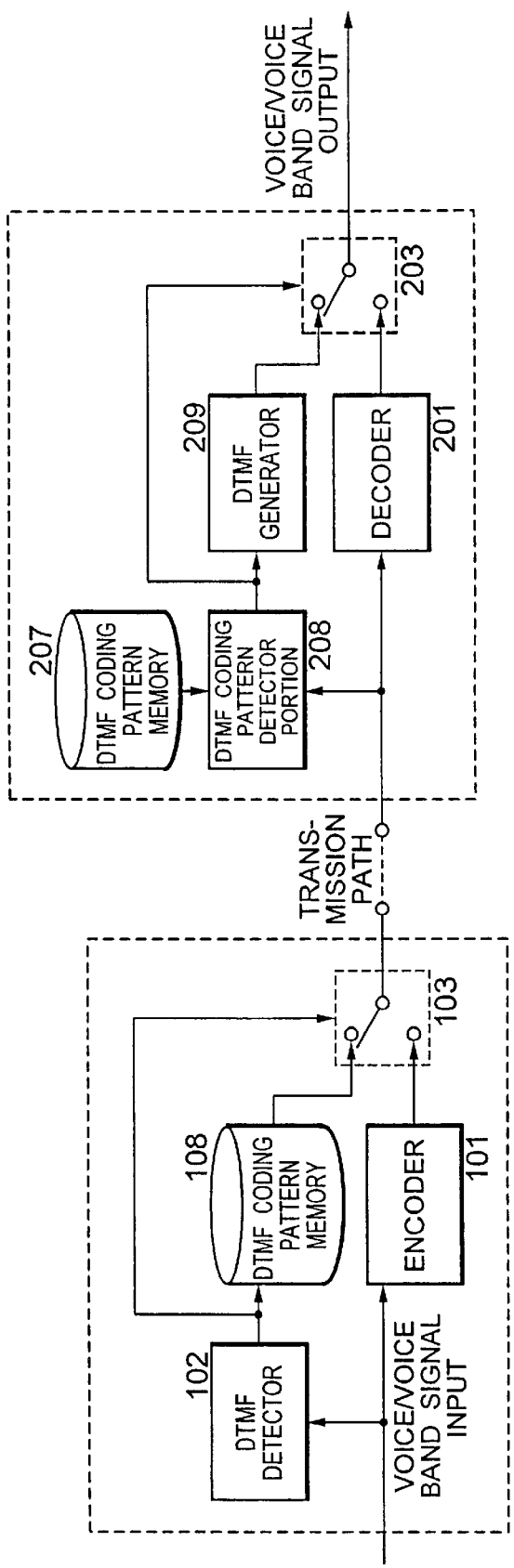
FIG. 12 is a diagram, showing another conventional encoder and decoder.
Figure 13:
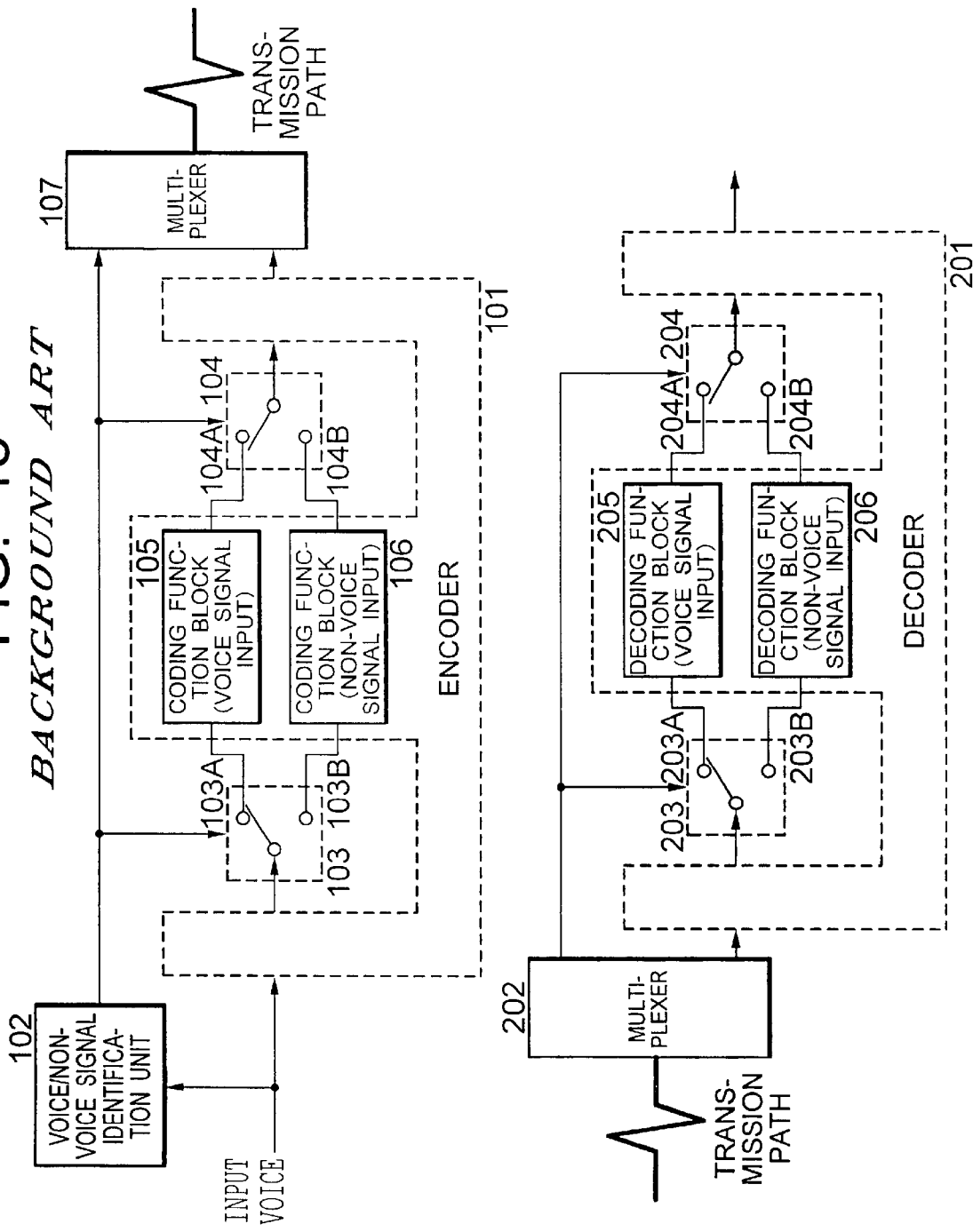
FIG. 13 is a diagram showing another conventional encoder and decoder.

The voice LSP quantizer 3A has the exactly same as that in FIG. 11. That is, it includes:

(1) Moving Average (MA) prediction component calculator portion 308

(2) first stage LSP quantizing code book 335, and (3) second stage LSP quantizing codebook 336. It also uses two methods of inter-frame prediction and multi-level quantization.

The quantizer 3A quantizes LSP that is a parameter of a frequency region by using a least square error as a determination criteria. That is, selected as a suitable quantized value is a value with a least square error. therefore, the quantization error can be often reflected on a voice signal decoded as a frequency distortion.

The human ear can detect a long term spectral distortion of voice as an annoying voice. However, if the frequency distortion is increased instantly in accordance with a given state of the MA prediction unit 308, the frequency distortion is not detected as a distortion, most of the time. However, the DTMF receiving regulation is strict on slight changes in a spectral peak (For example, according to TTC Standard JJ-20.12 "PBX-TDM Digital Interface (channel associated signalling)-PBX-PBX Signal Regulation" PB signal receiving regulation, a frequency deviation from the signal frequency specified in the PB sending regulation is specified as within ±1.8%. Thus, originally, it is weak to the spectral distortion.

Further, some structures of the DTMF detector used in an exchange, for example, might capture the DTMF instant spectral as a sample for detection. If a DTMF signal encoded and decoded efficiently by using the LSP quantizer 309A is captured as a sample in a time zone where its spectral distortion is increased instantly in accordance to a state of the MA prediction unit 308, it is influenced by the LSP quantization error to the maximum extent. Thus, the signal may not be identified as a DTMF signal. Therefore, frequency distortion in DTMF transmission needs more attention than those in voice transmission.

Some commercially available DTMF detectors identify between voice and DTMF and therefore use a method ,for detecting high frequency peaks such as the third formant. However, it is not for strict detection in comparison with detection of frequency components of a main signal. Therefore, the components other than frequency components composing DTMF may not cause deterioration of DTMF transmission characteristics even though it is not strict on distortion. that is, in order to decode a DTMF signal without distortion. it is important to minimize the quantization error in frequency range its spectral peak. In the frequency range, which is not related to the other DTMF detection, quantization errors to some extent can be tolerated. According to the trade-off relationship, the DTMF quantizer 309B arranged so that an increase in quantization error for the other frequency components is accepted and the quantization error near the frequency component composing the DTMF is minimized, for example.

As described above, the spectral distortion due to quantization is arranged to be minimized in the vicinity of the tone frequency, which is critical for the DTMF detection. As a result, it can produce effect that a DTMF signal, which is faithful to an original signal can be decoded.

Figure 3:
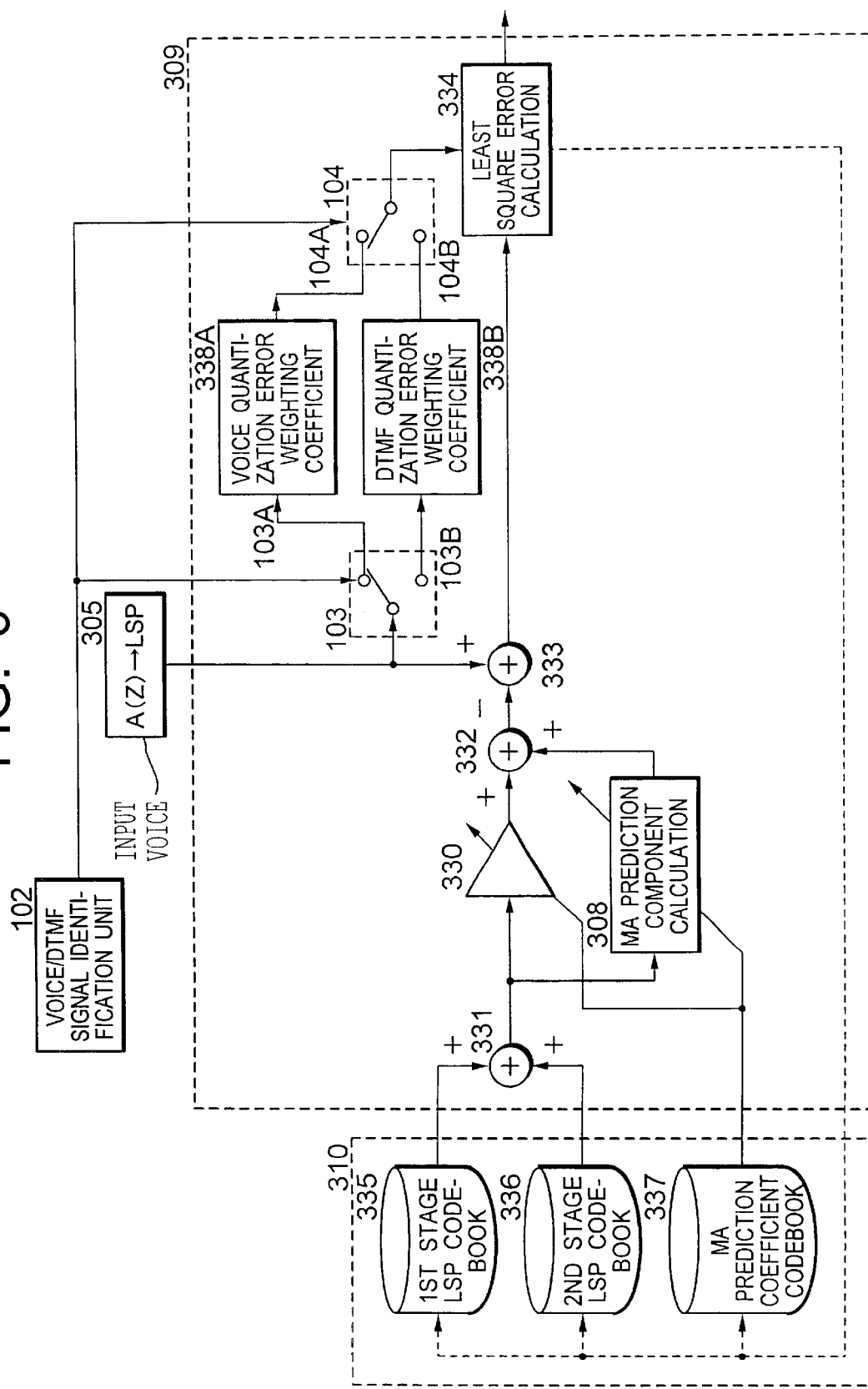
FIG. 3 is a block diagram showing a configuration of a voice encoder in EXAMPLE 3 according to the present invention.

Example 3 the third example according to the present invention will be described with reference to FIG. 3 as follows: In this example, a quantization error weighting coefficient calculator portion 338, that is a function block within the LSP quantizing block 309 in the second example, is arranged to be able to switch adaptively between voice input and DTMF input based on a determination result by the voice/DTMF signal identification unit 102. FIG. 3 include's a voice weighting coefficient calculator portion 338A, which is arranged to be able to evaluate a quantization error of a voice signal LSP coefficient suitably and a DTMF weighting coefficient calculator portion 338B, which is arranged to be able to evaluate a quantization error of a DTMF, LSP coefficient suitably.

Next, an operation will be described. In this example, a weighting coefficient used for quantization error calculation is calculated based on a method described in equations (1) below according to CS-ACELP method.

$$w_1 = \begin{cases} 1.0 & \text{if } \omega_2 - 0.04\pi - 1 > 0, \\ 10(\omega_2 - 0.04\pi - 1)^2 + 1 & \text{otherwise} \end{cases} \quad (1)$$

$$w_i(2 \leq i \leq 9) = \begin{cases} 1.0 & \text{if } \omega_{i+1} - \omega_{i-1} - 1 > 0, \\ 10(\omega_{i+1} - \omega_{i-1} - 1) & \text{otherwise} \end{cases}$$

$$w_{10} = \begin{cases} 1.0 & \text{if } -\omega_9 + 0.92\pi - 1 > 0, \\ 10(-\omega_9 + 0.92\pi - 1)^2 + 1 & \text{otherwise} \end{cases}$$

where $\omega i$ is i-th LSP coefficient.

That is, a weighting coefficient is weighted for a frequency range with a spectral peak while the weighting coefficient is lightened for a frequency range with spectral "valley." That is, weights equal to an amount related to the quantization error are allocated for the frequency range with spectral peak, which sharpens the sensitivity for errors. Here, when a DTMF signal is LSP-encoded, LSP with a higher order of weighting coefficient may correspond to a tone frequency. Increasing the weighting coefficient corresponding to the tone frequency component allows the reduction of frequency distortion due to the quantization result locally.

In order to increase the weighting coefficient of the LSP coefficient, which might correspond to the DTMF tone: frequency, the same processing as that of the weighting calculator portion 338A is performed and, if the coefficient exceeds a certain threshold, the weighting coefficient may be multiplied by a correction value of 1 or above. For the threshold and the correction value are desirably obtained by calculating suitable values experimentally inconsideration of DTMF recognition ration on the receiver side and deterioration in voice quality due to mis-detection by the voice/DTMF signal identification unit 102, for example.

As described above, according to the third example of the present invention, the LSP quantization is arranged such that an evaluation criteria for the quantization error is changed in the vicinity of the dual tone frequency composing the DTMF signal, which minimizing spectral distortion in coding. Therefore, the DTMF signal more faithful to an original signal can be decoded.

Example 4

Figure 4:
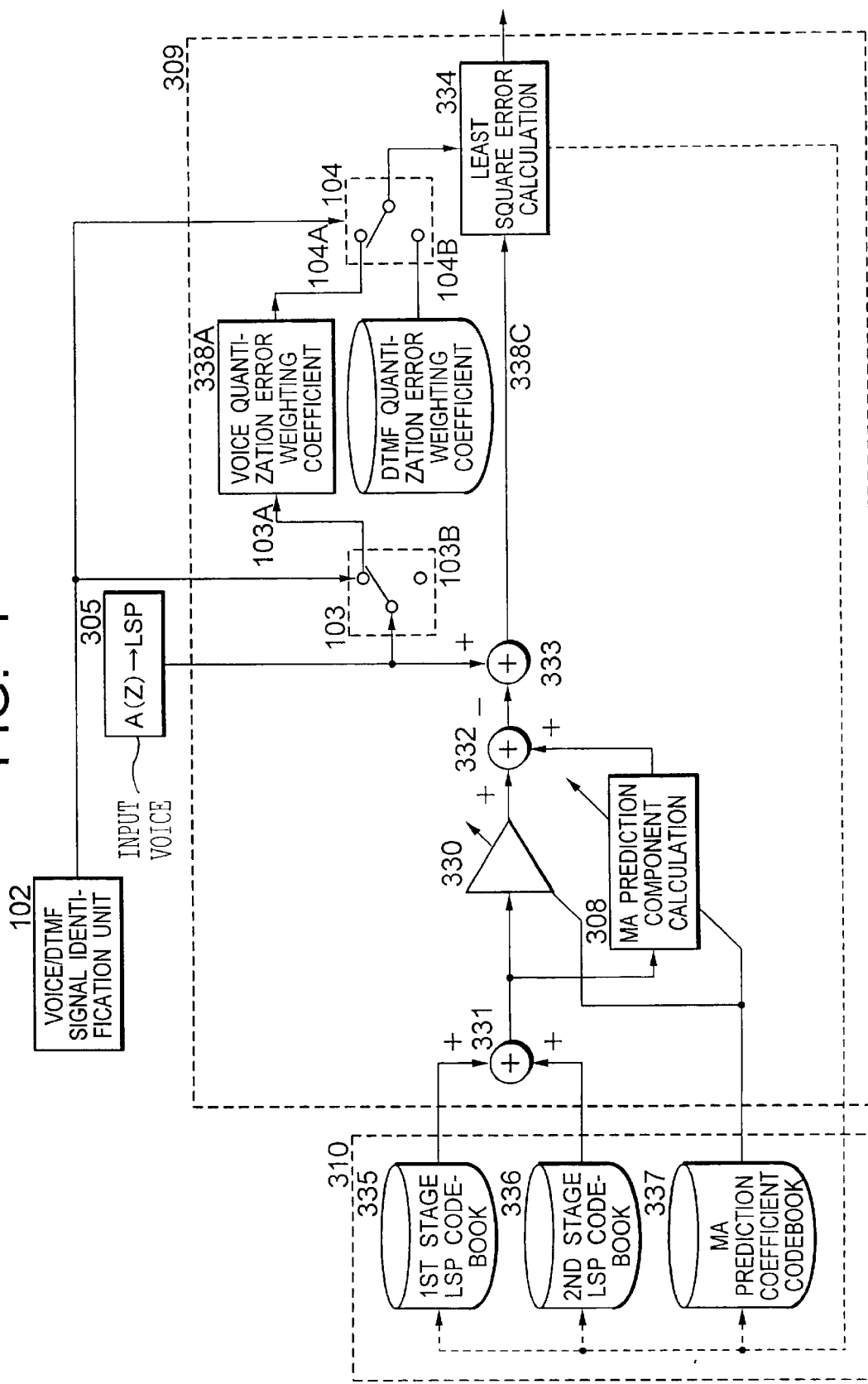
FIG. 4 is a block diagram showing a configuration of a voice encoder in EXAMPLE 4 according to the present invention.

A fourth example according to the present, invention will be described with reference to FIG. 4. In this example, the DTMF weighting coefficient calculating portion 338B is replaced by a weighting coefficient memory 338C.

Studying LSP coefficients of DTMF signals in detail indicates that a spectral peak corresponding to a lower frequency relates to first to third order of LSP coefficients (especially first and second orders of LSP, coefficients contribute largely among them). Further, it is understood that fourth to sixth orders of LSP coefficients relate to higher frequencies (again, fifth and sixth orders of LSP coefficients contribute largely). The other LSP coefficients do not relate to DTMF signal spectral envelop expression in most cases. In the memory 338C, a weighting progression allocating larger weights on first to sixth orders of LSP coefficients and extremely smaller weights on seventh to 10th orders of LSP coefficients is stored which is specified in some manner in advance. When the determination results by the voice/DTMF signal identification unit indicates "DTMF", a least square error is searched by using a weighting coefficient within the memory without calculating it based on pre-quantized LSP coefficients.

As described above, according to this example, it is no longer necessary to have the DTMF weighting coefficient calculating portion specifically. Therefore, advantageously, a program capacity for implementing an encoding algorithm can be reduced and further the encoding algorithm can be simplified for easier adoption.

Example 5

Figure 5:
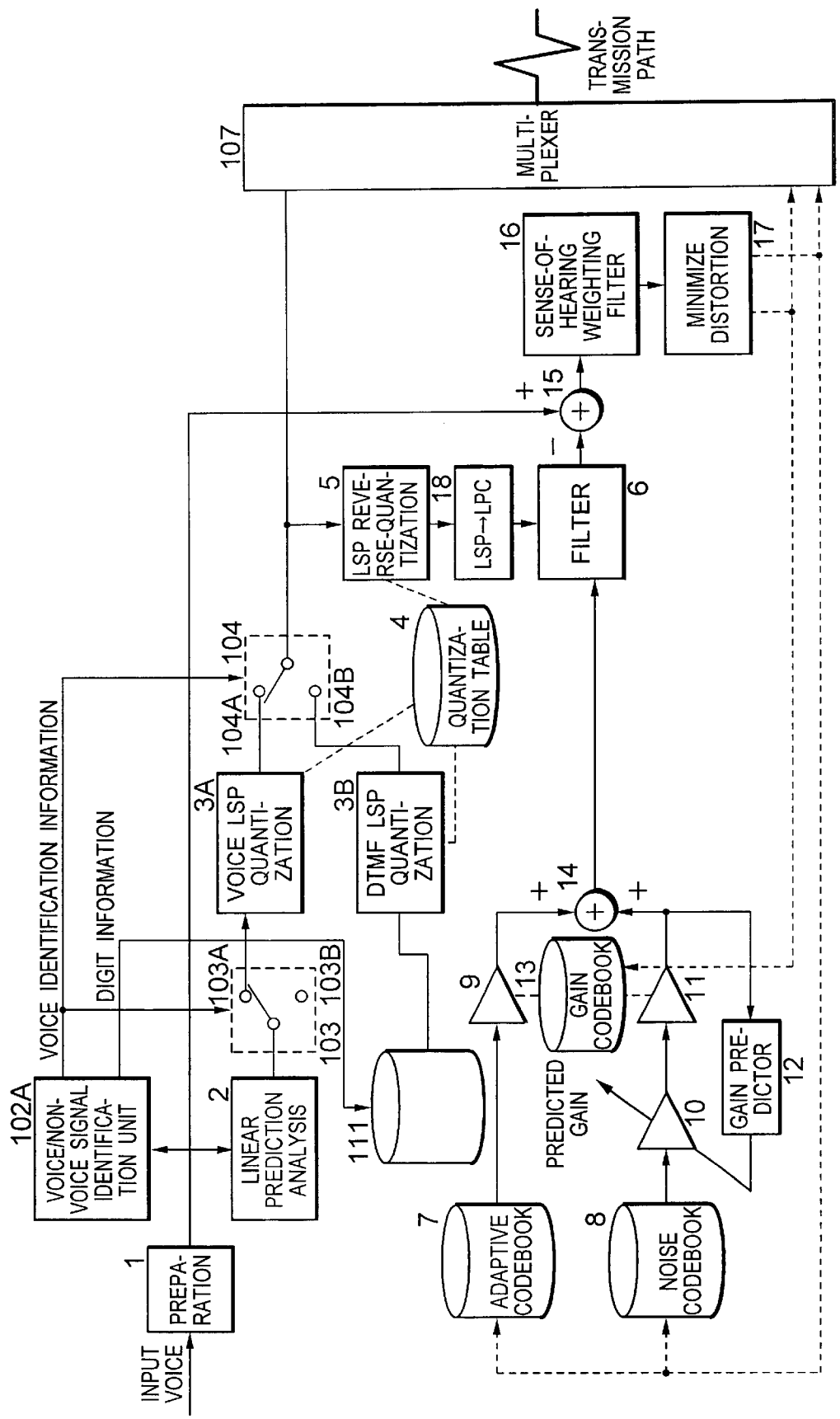
FIG. 5 is a block diagram showing a configuration of a voice encoder in EXAMPLE 5 according to the present invention.

The fifth example according to the present invention will be described with reference to FIG. 5. In this example, a digit detection function 102A is added to the voice/DTMF signal identification unit 102 of the example 2 and further a function for loading based on its digit detection result an appropriate LSP coefficient from a memory 111 where LSP coefficients are stored in advance.

Next, an operation will be described. a value of DTMF digit detected in the signal identification unit 102A is sent to the memory 111. In the memory 111, LSP coefficients corresponding to digits, respectively, are stored. An appropriate LSP coefficient is extracted therefrom based on an output from the signal identification unit 102A and send it to the LSP quantizer portion. The LSP coefficients stored in the memory are produced in an ideal DTMF waveform in advance. When a DTMF is detected, the DTMF LSP quantizer portion 3B is searched for a quantizing code book based: on the ideal LSP coefficients loaded from the memory and outputs index therefore.

Application of this example allows correction of DTMF signals input to the encoder with twist distortion and/or some frequency distortion at the time of LSP quantization. Therefore, the DTMF signal having a desirable characteristic can be sent.

Example 6

Figure 6:
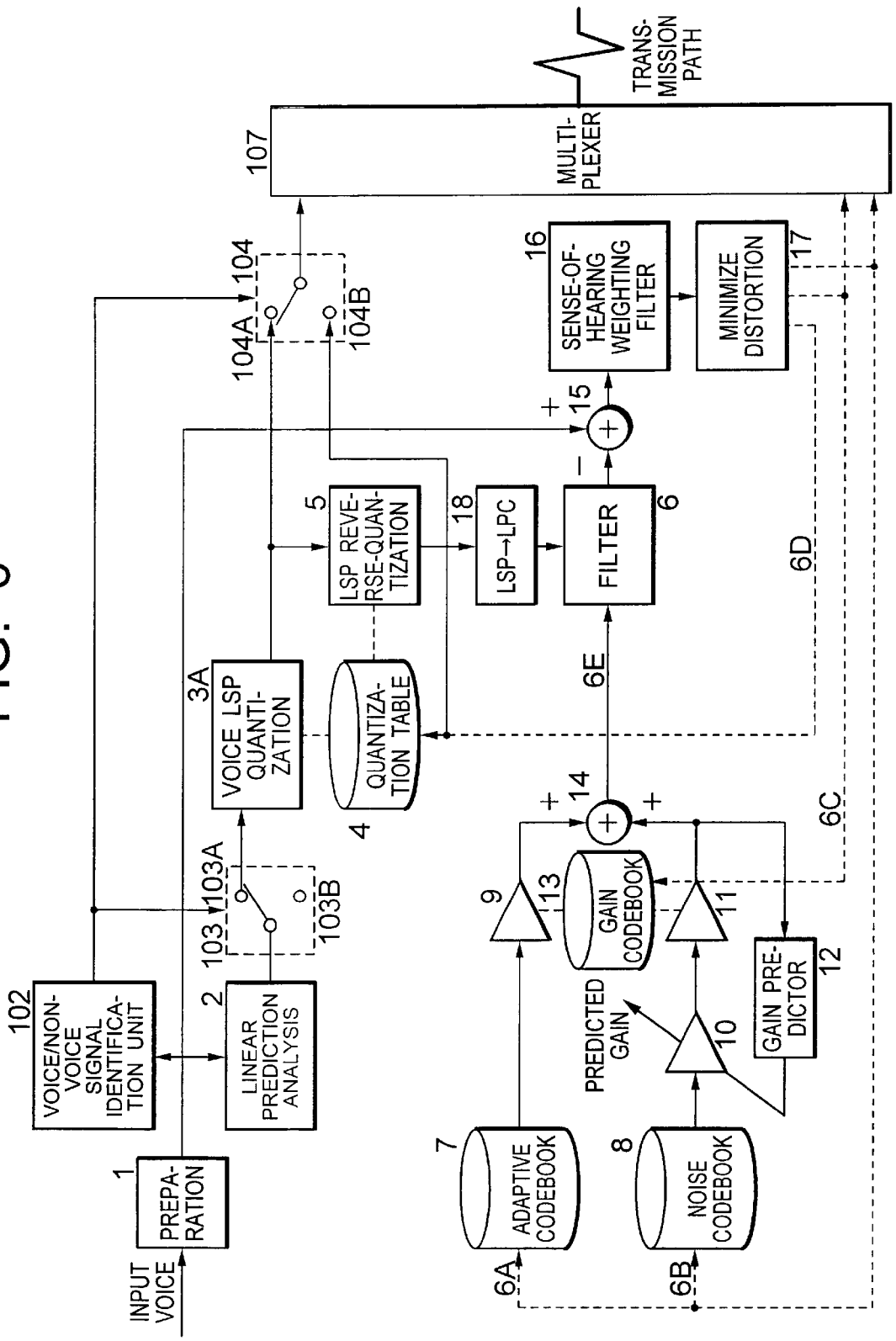
FIG. 6 is a block diagram showing a configuration of a voice encoder in EXAMPLE 6 according to the present invention.
Figure 7:
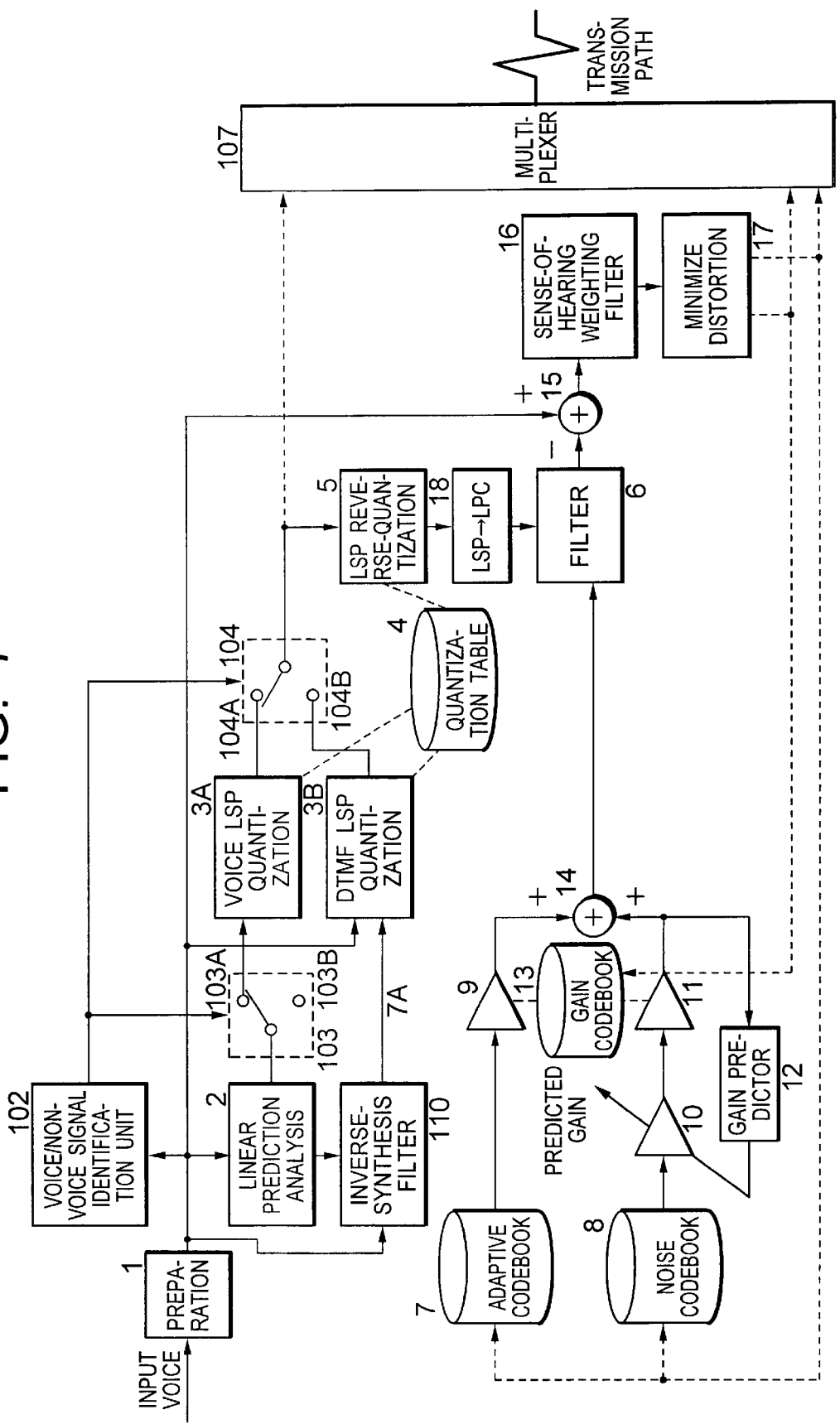
FIG. 7 is a block diagram showing a configuration of a voice encoder in EXAMPLE 7 according to the present invention.

The sixth example according to the present invention will be described with reference to FIG. 6. In this example, a so-called closed loop searching method is applied for searching an LSP codebook when DTMF is detection in the LSP quantizer portion 3B of the second example.

Next, an operation will be described. Operations of switches 103 and 104 by the signal identification unit 102 are the same as that in the second example. While encoding the human voice, that is, according to the conventional CS-ACELP method, an LSP coefficient is quantized first of all based on an input signal to determine a coefficient of the synthesis filter. Then, voice signals are merged by combining a adaptive code book index 6A, a noise code book index 6B and a drive signal gain code book index 6C differently and a combination of indices is determined such that a square error with the input voice signal is minimized.

On the other hand, for LSP quantization at the time of DTMF detection, the coefficient of the synthesis filter is not determined first but a synthesis voice :waveform to be decoded in the decoder is evaluated in the same manner as other three kinds of quantization parameters. First of all, the adaptive codebook index 6A, noise code book index 6B and drive signal gain code book index 6c, which are quantization parameters to be transmitter to the decoder, are synthesized to generate plural patterns of excitation signal 6E candidates of the synthesis filter. For each of the excitation signals 6E, plural patterns of LSP coefficients stored in the LSP codebook is used for generating a composite signal in the filter 6. In a least square error searching portion 17, square errors are calculated of the plural kinds of synthesized signals obtained as above and a voice signal 6F input to the encoder. Then, a combination of quantization parameters is selected such that the square error is the least among them. Each parameter is encoded and multiplexed in the multiplexer potion 107, which is transmitted to the decoder.

According to this example, voice is merged for all four kinds of combinations of the LSP codebook index 6D. Then, a square error between the input signal and the composite signal is calculated for each composite signal waveform to search the quantization parameter combination with the least square error. Therefore, DTMF signals with less waveform distortion can be decoded.

Example 7

Figure 8:
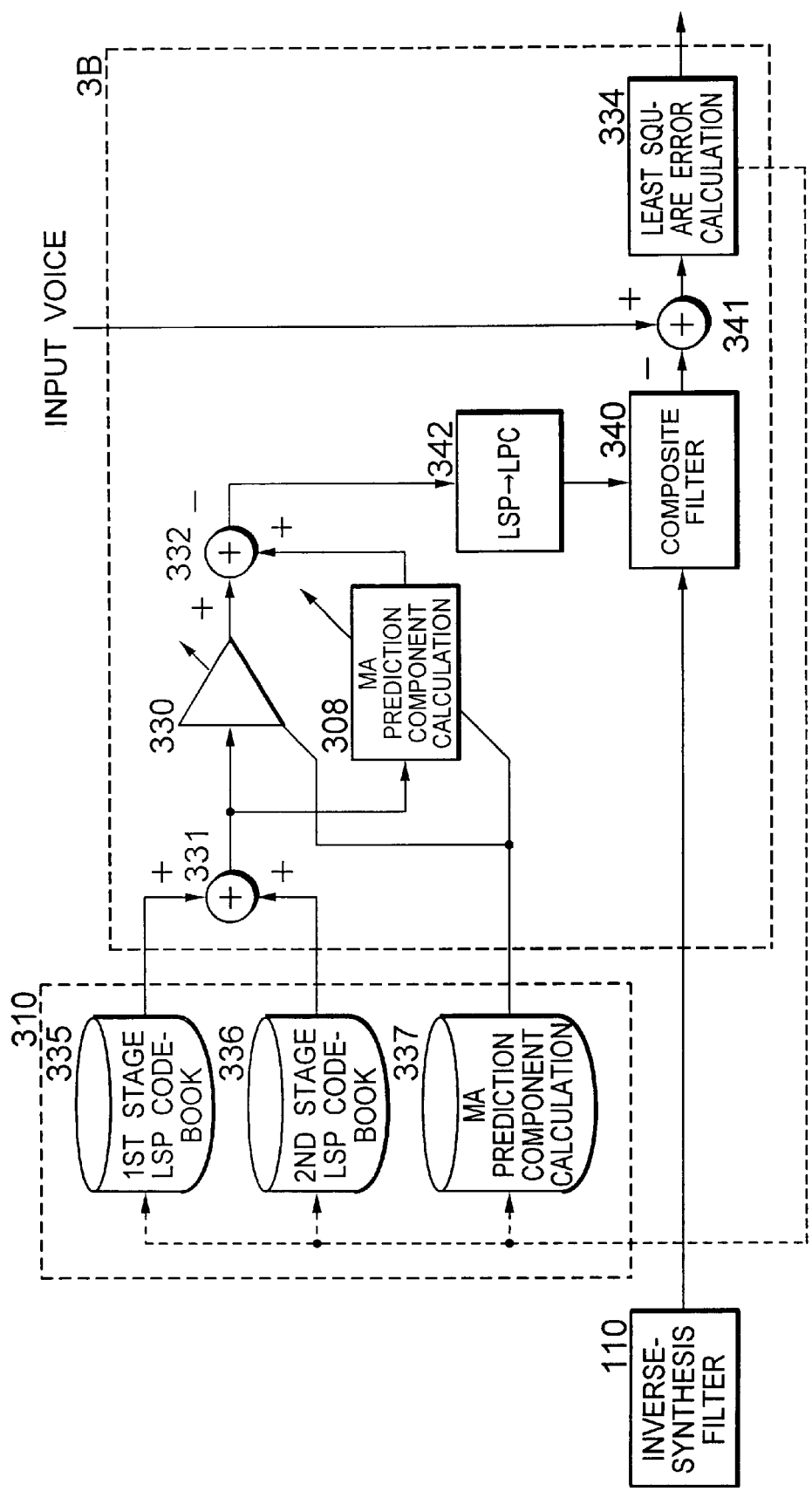
FIG. 8 is a block diagram showing a configuration of a voice encoder in EXAMPLE 8 according to the present invention.

The seventh example according to the present invention will be described with reference to FIGS. 8 and 9. In this example, plural kinds of drive signals used for LSP quantization evaluation in sixth example is replaced by prediction residual signals of input signals.

Next, an operation will be described. First of all, operations on switches 103 and 104 are the same as those in the second example. Linearly prediction analysis is performed on voice signals input to the encoder in the block 2. At the same time, the voice signals are input into a inverse-synthesis filter 110 which is configured by using a linear prediction coefficient obtained therefrom. A linear prediction residual signal 7A output from the inverse-synthesis filter 110 is input into the DTMF LSP quantized for the evaluation at the time of LSP quantization. The inverse-synthesis filter 110 can be configured by using a transmission function shown, for example, in an equation (2) below:

$$S^{-1}(z) = 1 + \sum_{i=1}^{10} \alpha_i z^{-i} \quad (2)$$

wherein αi is a linear prediction coefficient calculated in the linear prediction analyzer portion 2.

here, an operation of the DTMF LSP quantizer 3B will be described in detail with reference to FIG. 8. A plurality of quantization LSP coefficient candidate obtained from: combination of three kinds of LSP code books 335 to 337 and MA prediction is supplied to a synthesis filter 340 configured locally in the DTMF LSP quantizer 3B. The residual signal 7A generated in the filter is input into the filter in order to obtain a plurality of signals corresponding to respective LSP coefficient candidate. A square error between the plurality of composite signals:and voice signals input into the encoder is calculated, and then combination of LSP parameters with the least square error is searched. Then, its index is extracted and output.

In the sixth example, voice is merger with respect to all of quantization parameters, and a square error between each composite signal waveform and an input signal is calculated for evaluation. Thus, while an appropriate quantization parameter combination can be obtained, its calculation amount has been enormous. By using this example, while its performance is decreased to some extent, the quantization distortion and the amount of calculation are reduced. Thus, it is effective in that it can be implemented by using an inexpensive DSP with lower power consumption, for example.

Industrial Applicability

According to the present invention, coding and decoding are performed based on a method using a general voice coding/decoding algorithms more suitable for coding voices during voice signal transmission, or by switching a part of processing function block into a method more suitable for coding non-voice signals during non-voice signal, especially DTMF signal, transmission. Thus, high quality non-voice signals can be transmitted at the time of non-voice signal transmission without changing the transmission bit-rate.

Further, a part of functions of coding/decoding processing is changed but nothing related to the essential part of a given algorithm is switched. Thus, when the voice/non-voice signal identification unit 102 misidentifies a voice signal input as "non-voice", for example, a certain level of voice transmission quality can be maintained with some deterioration. Advantageously, it can prevent the problem that a noisy sound during call is also decoded.

Furthermore, even when a voice/non-voice signal identification unit configured based on an easy method and with lower identification performance is applied, a certain level of voice quality can be maintained. The simple device configuration can reduce manufacturing costs, advantageously.

What is claimed is:

1. A voice encoding device, comprising:
    an encoder having,
        a first quantizing block configured to voice encode input voice signals, and
        a second quantizing block configured to non-voice encode and to compressively encode input non-voice signals, wherein said first and second quantizing blocks include processing blocks configured to quantize line spectral pair (LSP) coefficients generated by an input signal processor;
    a voice/non-voice signal identification unit configured to identify whether a signal input to said encoder is at least one of a voice signal and a non-voice signal and to output a determination result; and
    a multiplexer portion configured to multiplex respective outputs from said first quantizing block and said second quantizing block and to output the respective outputs to a transmission path,
    wherein said encoder includes a selector configured to select one of said first quantizing block and said second quantizing block in accordance with said determination result from said voice/non-voice signal identification unit, and said first quantizing block and said second quantizing block are configured to compressively encode the input voice and non-voice signals by using a common quantization table.

2. A voice encoding device according to claim 1, wherein, when said LSP coefficient is quantized, said first and second quantizing blocks have evaluation criteria to be used for determining an appropriate quantized value for each of said first and second quantizing blocks.

3. A voice encoding device according to claim 2, wherein, when said LSP coefficient is quantized, the evaluation criteria used for determining the appropriate quantized value is changed adaptively in accordance with characteristics of an input voice signal in said first quantizing block, and said evaluation criteria are constant regardless of characteristics of an input voice signal in said second quantizing block.

4. A voice encoding device according to claim 1, wherein said voice/non-voice signal identification unit comprises:
    a digit detector configured to detect a digit of a dual-tone-multi-frequency (DTMF) signal and to input a line spectral pair (LSP) coefficient to said second quantizing block.

5. A voice encoding device according to of claim 1, wherein said voice/non-voice signal identification unit is configured to closed loop search a line spectral pair (LSP) codebook.

6. A voice encoding device according to claim 5, wherein said second quantizing block is configured to use a linear prediction residual signal of an input voice signal as a parameter used for determining an appropriate quantized value.

* * * * *